US012463105B2

(12) United States Patent
Kang et al.

(10) Patent No.: US 12,463,105 B2
(45) Date of Patent: Nov. 4, 2025

(54) SEMICONDUCTOR PACKAGE INCLUDING A DUMMY CHIP

(71) Applicant: Samsung Electronics Co., Ltd., Suwon-si (KR)

(72) Inventors: Hyeongmun Kang, Hwaseong-si (KR); Taehyeong Kim, Suwon-si (KR); Woodong Lee, Cheonan-si (KR); Hwanyoung Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 563 days.

(21) Appl. No.: 17/464,002

(22) Filed: Sep. 1, 2021

(65) Prior Publication Data

US 2022/0278010 A1    Sep. 1, 2022

(30) Foreign Application Priority Data

Feb. 26, 2021    (KR) .................. 10-2021-0026409

(51) Int. Cl.
*H01L 23/31* (2006.01)
*H01L 21/56* (2006.01)
(Continued)

(52) U.S. Cl.
CPC .......... *H01L 23/3135* (2013.01); *H01L 21/56* (2013.01); *H01L 24/32* (2013.01);
(Continued)

(58) Field of Classification Search
CPC ..... H01L 21/56; H01L 21/563; H01L 21/568; H01L 2224/0557; H01L 2224/06181;
(Continued)

(56) References Cited

U.S. PATENT DOCUMENTS 9,721,930 B2 *   8/2017   Lee .................. H01L 25/50
9,991,234 B2 *   6/2018   Seo .................. H01L 23/3128
(Continued)

FOREIGN PATENT DOCUMENTS

CN    101047170 A  * 10/2007
CN    104701289 A  *  6/2015   ............. H01L 23/12
(Continued)

*Primary Examiner* — Telly D Green
(74) *Attorney, Agent, or Firm* — Wolf, Greenfield & Sacks, P.C.

(57) ABSTRACT

A semiconductor package includes a base structure, a lower semiconductor chip disposed on the base structure, an upper semiconductor chip disposed on the lower semiconductor chip, a connecting structure including a lower pad disposed on the lower semiconductor chip, an upper pad disposed under the upper semiconductor chip, and a connecting bump disposed between the lower pad and the upper pad, a dummy chip disposed on the upper semiconductor chip, an upper adhesive layer including an upper adhesive portion disposed between the upper semiconductor chip and the dummy chip, and an upper protrusion portion disposed at opposite sides of the upper adhesive portion, to surround lower portions of opposite side surfaces of the dummy chip, and a molding layer disposed at opposite sides of the dummy chip, to surround upper portions of the opposite side surfaces of the dummy chip and the upper protrusion portion.

13 Claims, 14 Drawing Sheets

(51) Int. Cl.
*H01L 23/00* (2006.01)
*H01L 25/00* (2006.01)
*H01L 25/065* (2023.01)

(52) U.S. Cl.
CPC .......... *H01L 24/33* (2013.01); *H01L 25/0652* (2013.01); *H01L 25/0657* (2013.01); *H01L 25/50* (2013.01); H01L 24/05 (2013.01); H01L 24/06 (2013.01); H01L 24/16 (2013.01); H01L 24/73 (2013.01); H01L 2224/0557 (2013.01); H01L 2224/06181 (2013.01); H01L 2224/16245 (2013.01); H01L 2224/32059 (2013.01); H01L 2224/3207 (2013.01); H01L 2224/32145 (2013.01); H01L 2224/32245 (2013.01); H01L 2224/33181 (2013.01); H01L 2224/33183 (2013.01); H01L 2224/73204 (2013.01); H01L 2225/06513 (2013.01); H01L 2225/06541 (2013.01); H01L 2225/06582 (2013.01); H01L 2924/182 (2013.01)

(58) Field of Classification Search
CPC . H01L 2224/16245; H01L 2224/32059; H01L 2224/3207; H01L 2224/32145; H01L 2224/32245; H01L 2224/33181; H01L 2224/33183; H01L 2224/73204; H01L 2225/06513; H01L 2225/06517; H01L 2225/06541; H01L 2225/06582; H01L 23/3128; H01L 23/3135; H01L 23/481; H01L 24/05; H01L 24/06; H01L 24/16; H01L 24/32; H01L 24/33; H01L 24/73; H01L 25/0652; H01L 25/0657; H01L 25/18; H01L 25/50; H01L 2924/00; H01L 2924/182

See application file for complete search history.

(56) References Cited

U.S. PATENT DOCUMENTS

| | | | |
|---|---|---|---|
| 11,081,425 B2* | 8/2021 | Chang | H01L 23/49816 |
| 11,393,764 B2* | 7/2022 | Nam | H01L 25/03 |
| 11,848,274 B2* | 12/2023 | Nam | H01L 24/17 |
| 2008/0099898 A1 | 5/2008 | Cui et al. | |
| 2008/0136005 A1 | 6/2008 | Lee et al. | |
| 2011/0058348 A1* | 3/2011 | Sakai | H01L 27/0688 361/803 |
| 2013/0082399 A1* | 4/2013 | Kim | H01L 24/81 257/E23.145 |
| 2013/0249116 A1 | 9/2013 | Mohammed et al. | |
| 2014/0057391 A1 | 2/2014 | Lin et al. | |
| 2014/0084456 A1 | 3/2014 | Kang et al. | |
| 2015/0162265 A1* | 6/2015 | Jo | H01L 25/50 257/774 |
| 2016/0064365 A1 | 3/2016 | Jang et al. | |
| 2017/0005075 A1* | 1/2017 | Lee | H01L 23/3135 |
| 2017/0365582 A1* | 12/2017 | Seo | H01L 24/33 |
| 2017/0365591 A1 | 12/2017 | Chang et al. | |
| 2019/0206841 A1* | 7/2019 | Kim | H01L 25/0657 |
| 2019/0221520 A1* | 7/2019 | Kim | H01L 24/06 |
| 2019/0229091 A1* | 7/2019 | Kim | H01L 24/96 |
| 2019/0244946 A1* | 8/2019 | Kim | H01L 23/552 |
| 2019/0259743 A1* | 8/2019 | Han | H01L 25/0657 |
| 2020/0013753 A1* | 1/2020 | Kim | H01L 23/528 |
| 2020/0066653 A1* | 2/2020 | Kamphuis | H01L 24/85 |
| 2020/0144159 A1* | 5/2020 | Chang | H01L 23/49816 |
| 2020/0402935 A1* | 12/2020 | Choi | H01L 24/20 |
| 2021/0074660 A1* | 3/2021 | Lee | H01L 24/05 |
| 2021/0104489 A1* | 4/2021 | Park | H01L 21/563 |
| 2021/0134761 A1* | 5/2021 | Oh | H01L 21/565 |
| 2021/0143008 A1* | 5/2021 | Ko | H01L 25/0657 |
| 2021/0143126 A1* | 5/2021 | Choi | H01L 25/0652 |
| 2021/0151410 A1* | 5/2021 | Hwang | H01L 25/0657 |
| 2021/0159178 A1* | 5/2021 | Nam | H01L 24/14 |
| 2021/0343689 A1* | 11/2021 | Park | H01L 24/73 |
| 2021/0375709 A1* | 12/2021 | Ko | H01L 23/3135 |
| 2022/0223566 A1* | 7/2022 | Lee | H01L 23/3135 |

FOREIGN PATENT DOCUMENTS

| | | | | |
|---|---|---|---|---|
| CN | 105390467 B | * | 1/2019 | ............ H01L 21/56 |
| KR | 20130024567 A | * | 3/2013 | |
| KR | 20200052181 A | * | 5/2020 | |
| WO | WO-2020264167 A1 | * | 12/2020 | |

* cited by examiner

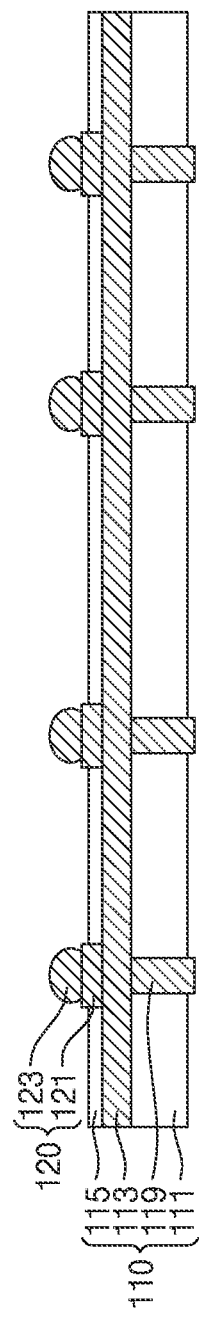
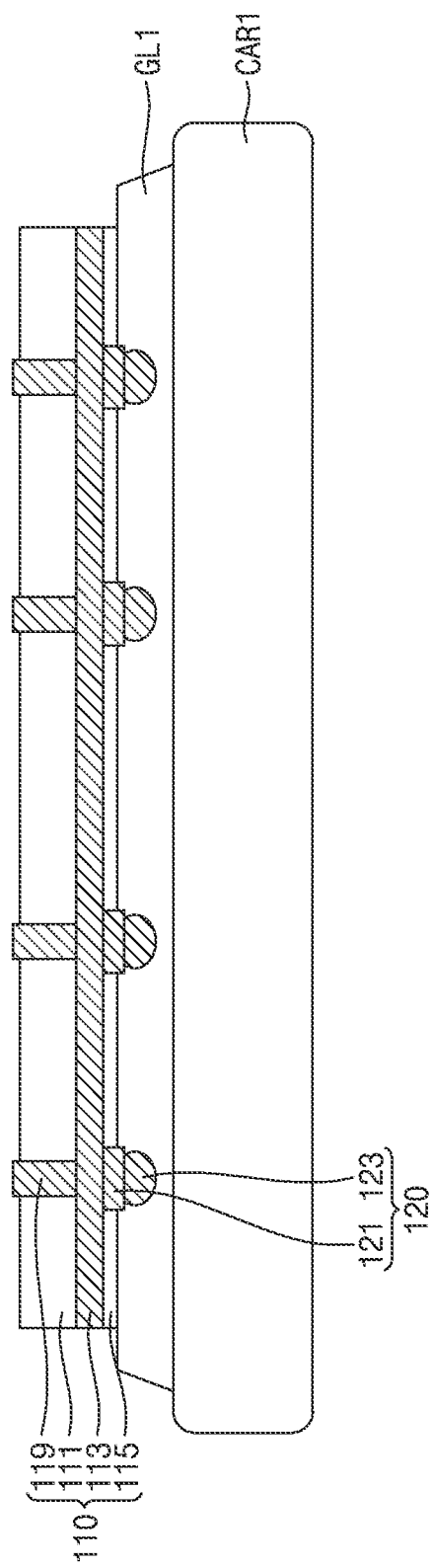

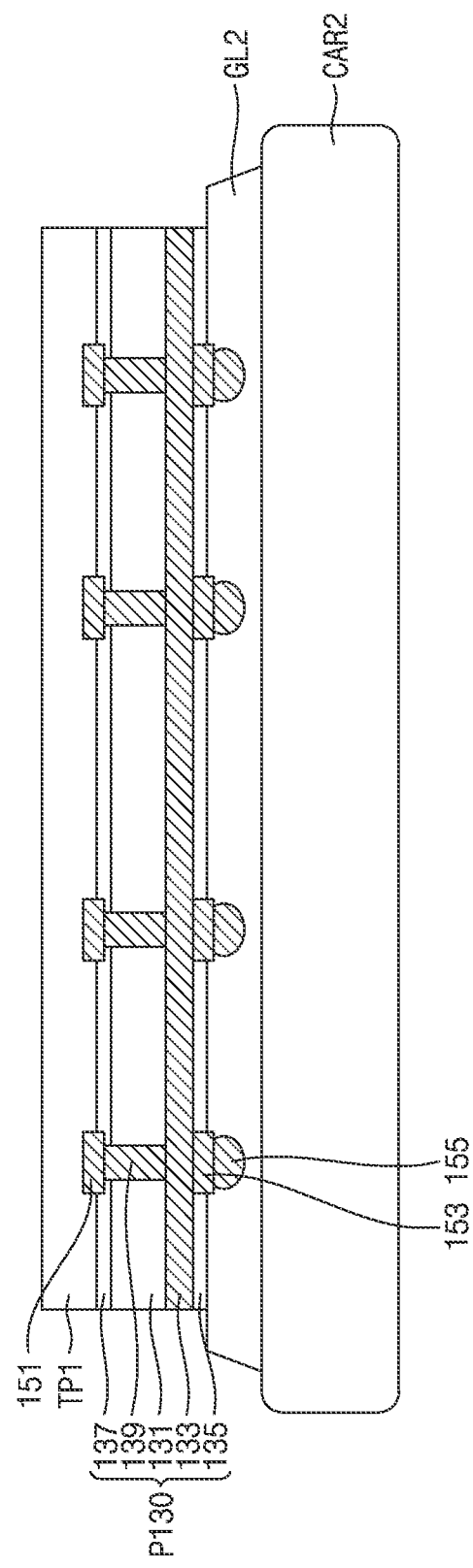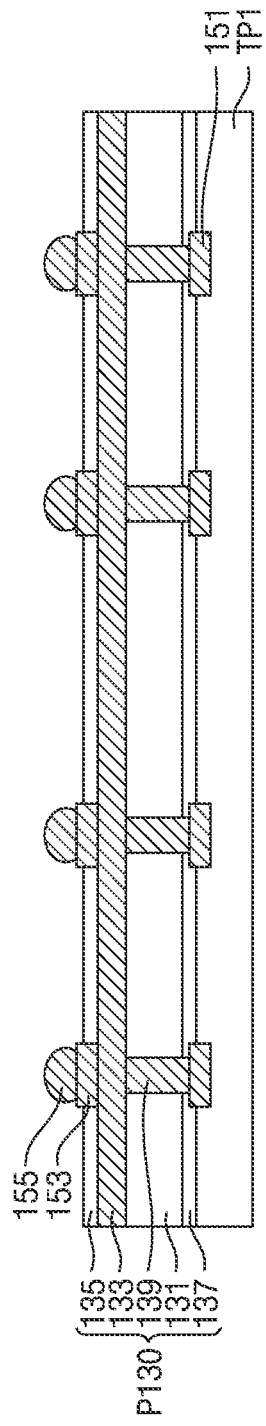

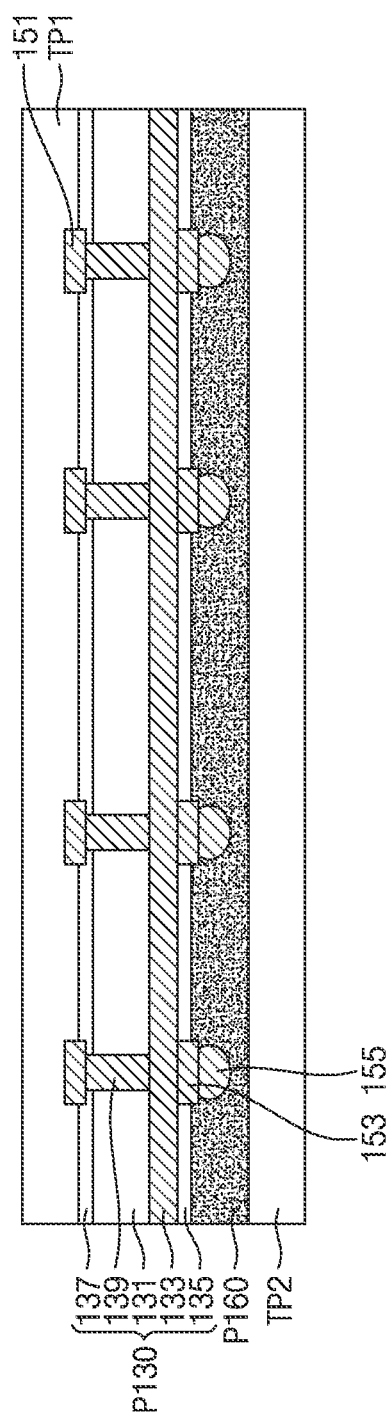
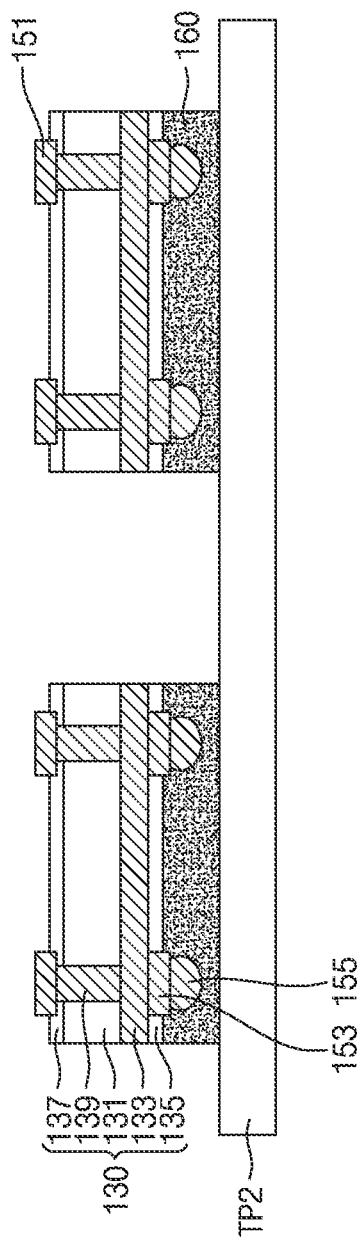

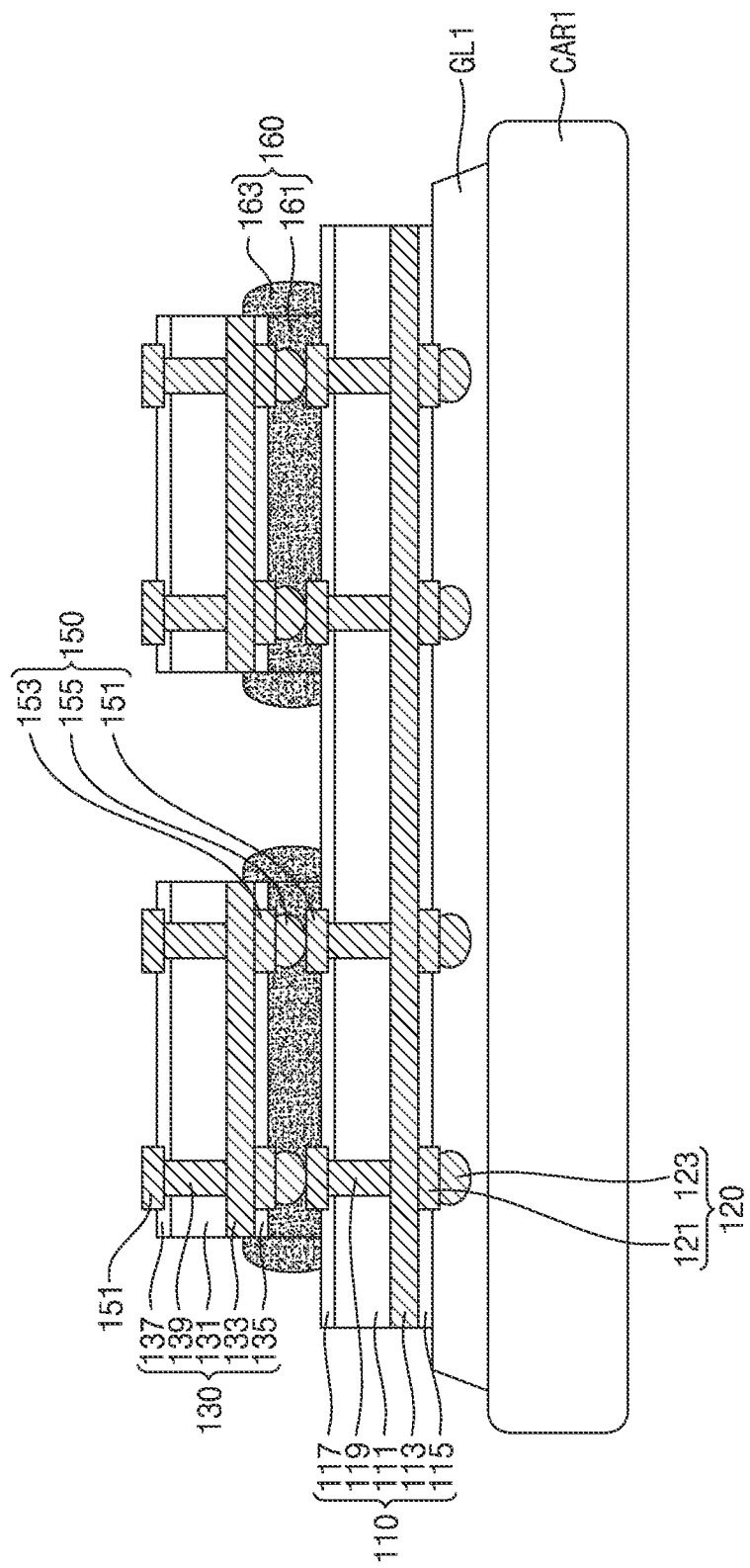

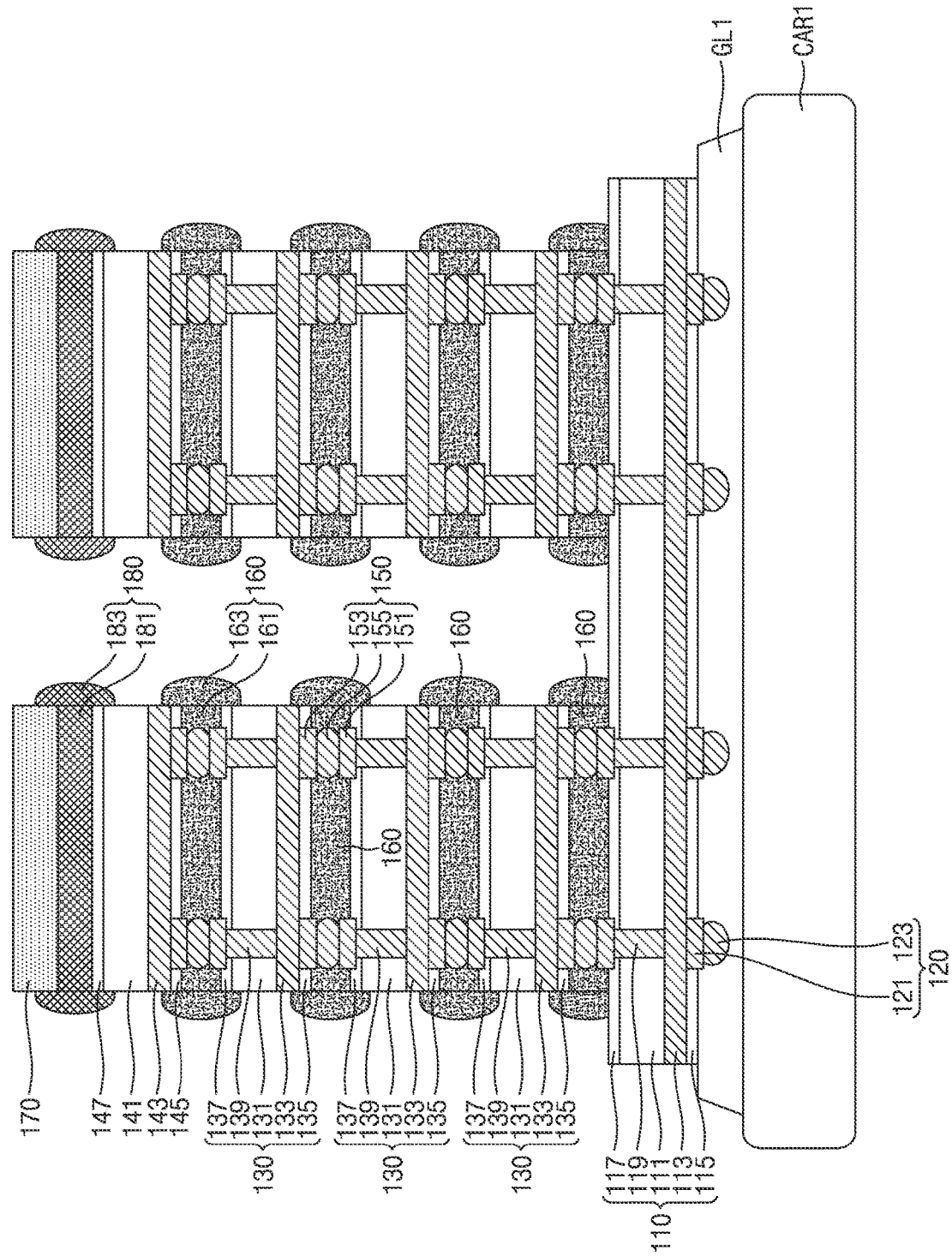

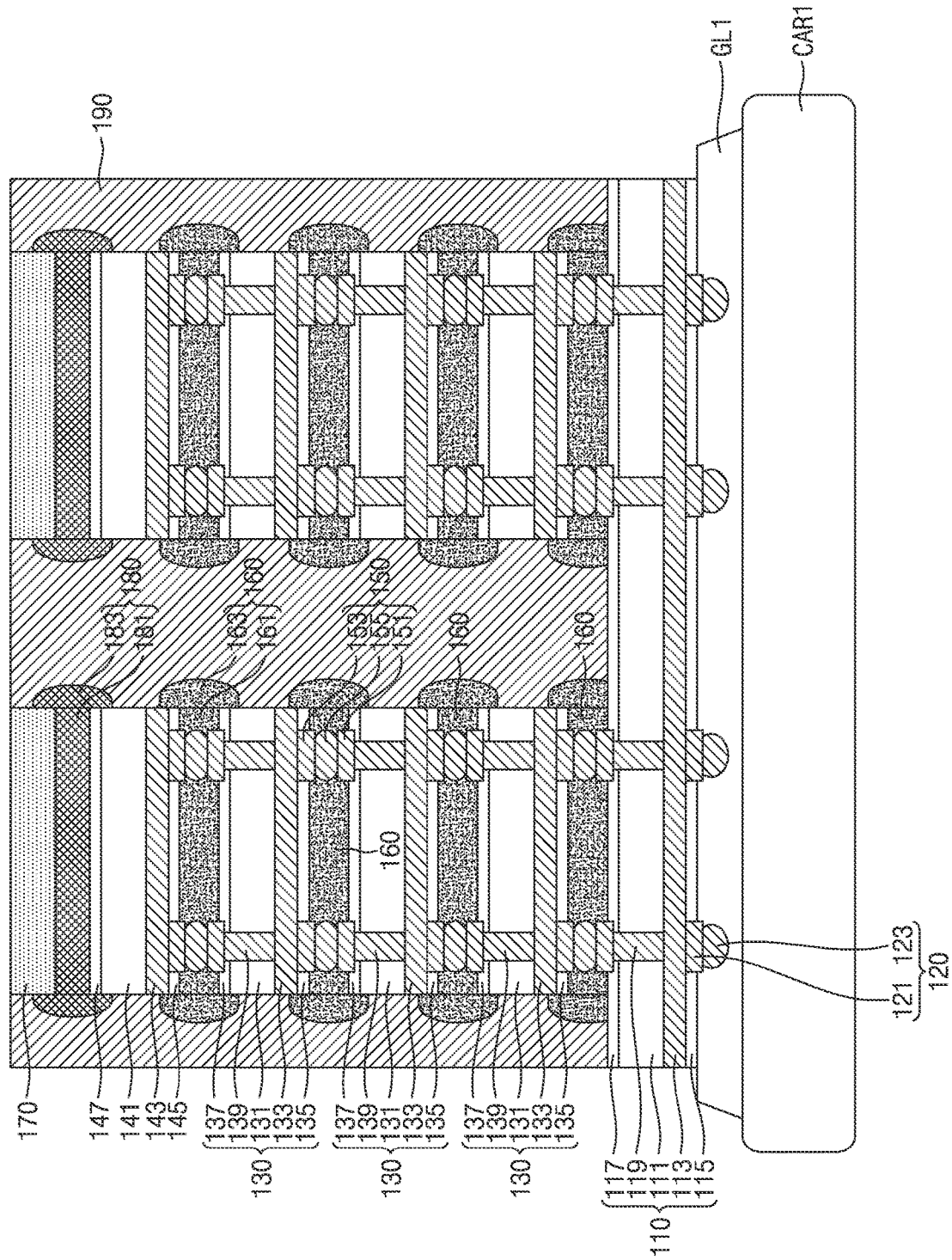

SEMICONDUCTOR PACKAGE INCLUDING A DUMMY CHIP

CROSS-REFERENCE TO THE RELATED APPLICATION

This application claims priority from Korean Patent Application No. 10-2021-0026409, filed on Feb. 26, 2021, in the Korean Intellectual Property Office, the disclosure of which is incorporated herein by reference in its entirety.

BACKGROUND

The example embodiments of the disclosure relate to a semiconductor package including a dummy chip.

In accordance with advances in electronics and demands of users, electronic appliances become further miniaturized and lightened, and semiconductor packages used in electronic appliances are required to have high performance and a large capacity in addition to miniaturization and lightness. In order to achieve high performance and a large capacity as well as miniaturization and lightness, research and development of semiconductor chips including a through-silicon via (TSV) and a semiconductor package in which the semiconductor chips are stacked is being continuously conducted.

SUMMARY

The example embodiments of the disclosure provide a semiconductor package having enhanced reliability.

A semiconductor package according to an example embodiment of the disclosure includes a base structure, a lower semiconductor chip disposed on the base structure, an upper semiconductor chip disposed on the lower semiconductor chip, a connecting structure including a lower pad disposed on the lower semiconductor chip, an upper pad disposed under the upper semiconductor chip, and a connecting bump disposed between the lower pad and the upper pad, a dummy chip disposed on the upper semiconductor chip, an upper adhesive layer including an upper adhesive portion disposed between the upper semiconductor chip and the dummy chip, and an upper protrusion portion disposed at opposite sides of the upper adhesive portion, to surround lower portions of opposite side surfaces of the dummy chip, and a molding layer disposed at opposite sides of the dummy chip, to surround upper portions of the opposite side surfaces of the dummy chip and the upper protrusion portion of the upper adhesive layer.

A semiconductor package according to an example embodiment of the disclosure includes a base structure, a lower semiconductor chip on the base structure, an upper semiconductor chip on the lower semiconductor chip, a connecting structure including a lower pad on the lower semiconductor chip, an upper pad under the upper semiconductor chip, and a connecting bump between the lower pad and the upper pad, a lower adhesive layer including a lower adhesive portion between the lower semiconductor chip and the upper semiconductor chip, and a lower protrusion portion at opposite sides of the lower adhesive portion, to surround at least one of upper portions of opposite side surfaces of the lower semiconductor chip and lower portions of opposite side surfaces of the upper semiconductor chip, a dummy chip on the upper semiconductor chip, a solder between the upper semiconductor chip and the dummy chip, and a molding layer surrounding a side surface of the dummy chip and the solder.

A semiconductor package according to an example embodiment of the disclosure includes a base structure, a connecting terminal including a base pad at a bottom portion of the base structure, and a base bump under the base pad, a lower semiconductor chip on the base structure, the lower semiconductor chip including a semiconductor substrate, a first wiring layer under the semiconductor substrate, a first lower protective layer under first the wiring layer, a first upper protective layer on the semiconductor substrate, and a through via extending through the semiconductor substrate and the first upper protective layer, an upper semiconductor chip on the lower semiconductor chip, the upper semiconductor chip including a semiconductor substrate, a second wiring layer under the semiconductor substrate, a second lower protective layer under the second wiring layer, and a second upper protective layer on the semiconductor substrate, a connecting structure including a lower pad on the lower semiconductor chip and connected to the through via of the lower semiconductor chip, an upper pad under the upper semiconductor chip and connected to the second wiring layer of the upper semiconductor chip, and a connecting bump between the lower pad and the upper pad to interconnect the lower pad and the upper pad, a lower adhesive layer including a lower adhesive portion between the lower semiconductor chip and the upper semiconductor chip, and a lower protrusion portion at opposite sides of the lower adhesive portion, to surround at least one of upper portions of opposite side surfaces of the lower semiconductor chip and lower portions of opposite side surfaces of the upper semiconductor chip, a dummy chip on the upper semiconductor chip, an upper adhesive layer including an upper adhesive portion between the upper semiconductor chip and the dummy chip, and an upper protrusion portion at opposite sides of the upper adhesive portion to surround lower portions of opposite side surfaces of the dummy chip, and a molding layer at opposite sides of the dummy chip to surround upper portions of the opposite side surfaces of the dummy chip and the upper protrusion portion. A height of the upper adhesive portion is smaller than a height of the lower adhesive portion. A width of the upper protrusion portion is smaller than a width of the lower protrusion portion.

BRIEF DESCRIPTION OF THE DRAWINGS

FIGS. 2A to 2M are sectional views explaining a method for manufacturing a semiconductor package in accordance with an example embodiment of the disclosure.

DETAILED DESCRIPTION

Figure 1A:
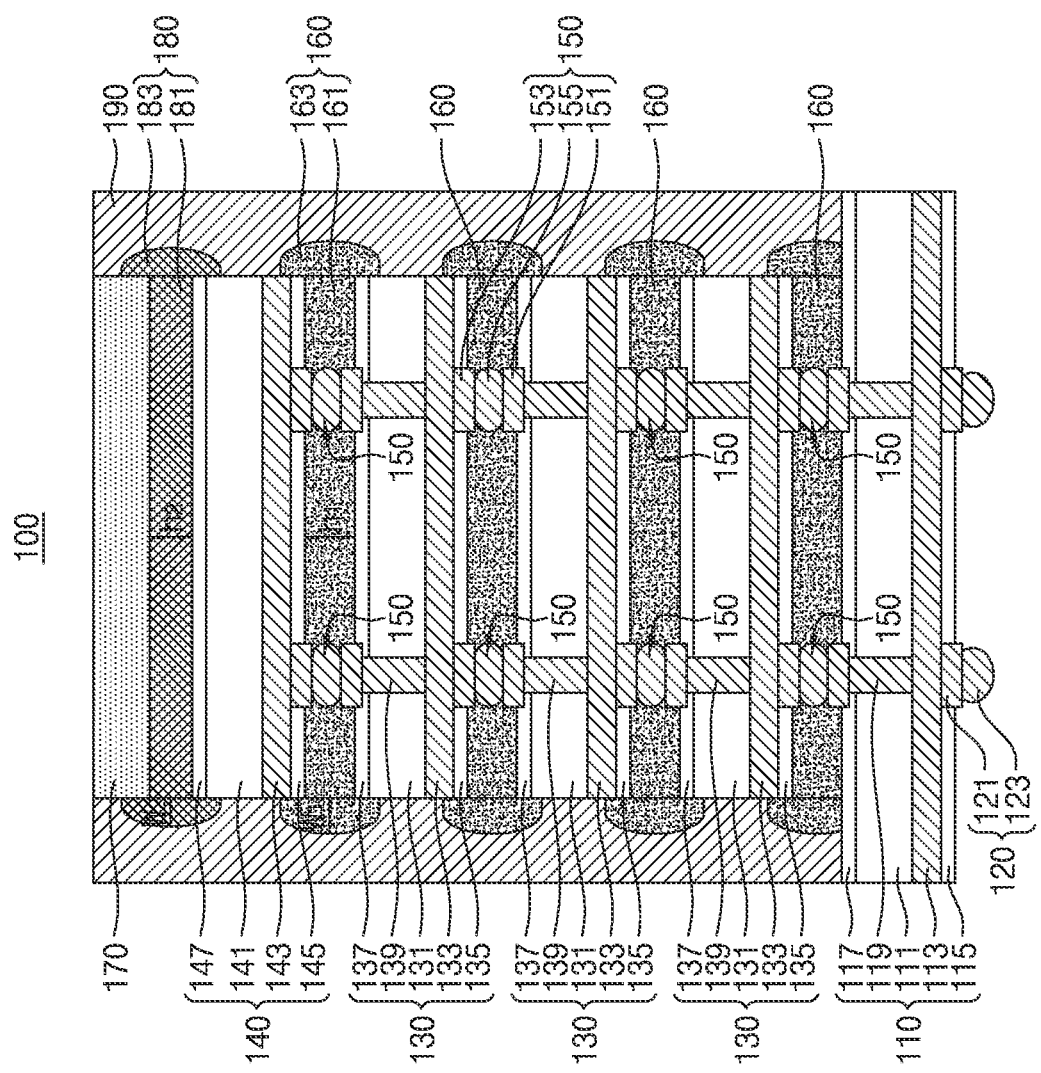
FIG. 1A is a sectional view of a semiconductor package according to an example embodiment of the disclosure.
Figure 1B:
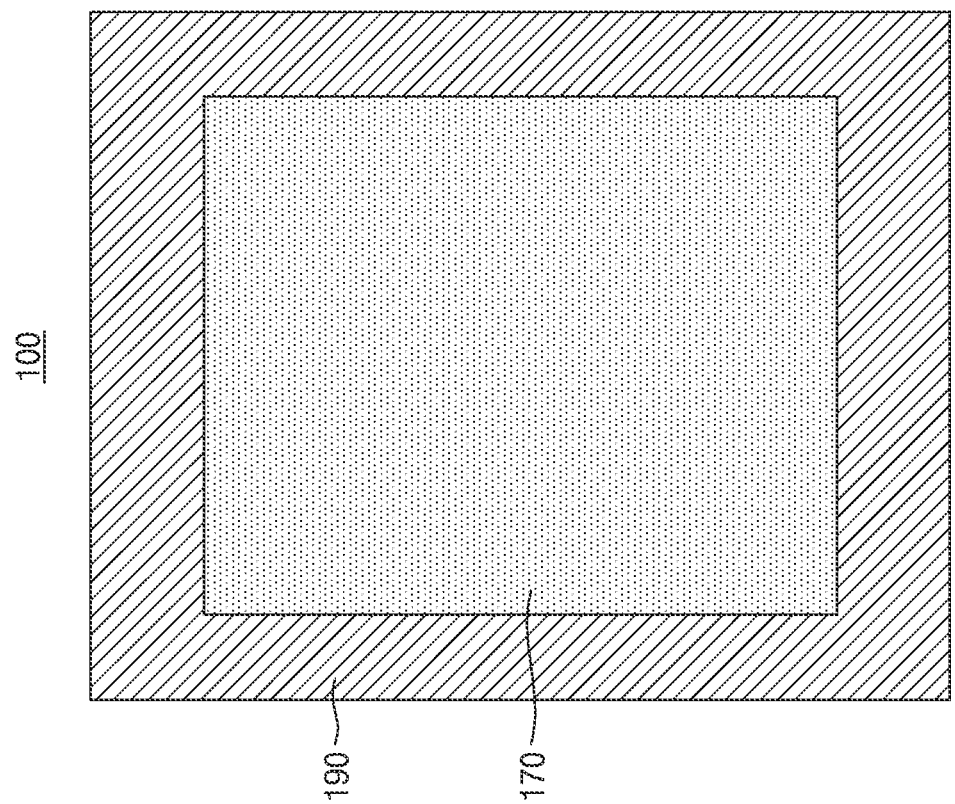
FIG. 1B is a sectional view taken when the semiconductor package of FIG. 1A is viewed in a top view.

FIG. 1A is a sectional view of a semiconductor package according to an example embodiment of the disclosure. FIG. 1B is a sectional view taken when the semiconductor package of FIG. 1A is viewed in a top view.

Referring to FIGS. 1A and 1B, a semiconductor package 100 may include a base structure 110, a connecting terminal 120, a lower semiconductor chip 130, an upper semiconductor chip 140, a connecting structure 150, a lower adhesive layer 160, a dummy chip 170, an upper adhesive layer 180, and a molding layer 190.

The base structure 110 may include a base substrate 111, a wiring layer 113, a lower protective layer 115, an upper protective layer 117, and a through via 119. In an embodiment, the base substrate 111 may include silicon, germanium, silicon-germanium, GaP, or GaAs. In another embodiment, the base substrate 111 may be a silicon-on-insulator (SOI) substrate or a germanium-on-insulator (GOI) substrate.

The wiring layer 113 may be disposed under the base substrate 111. The wiring layer 113 may include wirings, and an interlayer insulating layer receiving the wirings therein. For example, the wirings may include metal, metal nitride, metal silicide, doped polysilicon, etc. The interlayer insulating layer may include, for example, at least one of low-k dielectric materials such as silicon oxide, silicon oxide doped with fluorine or carbon, porous silicon oxide, a spin-on organic polymer, or an inorganic polymer.

The lower protective layer 115 may be disposed under the wiring layer 113. The lower protective layer 115 may cover a bottom surface of the wiring layer 113. The lower protective layer 115 may protect the wiring layer 113. The lower protective layer 115 may include an insulating material.

The upper protective layer 117 may be disposed on or over the base substrate 111. The upper protective layer 117 may cover a top surface of the base substrate 111. The upper protective layer 117 may protect the base substrate 111. The upper protective layer 117 may include an insulating material.

The through via 119 may extend through the base substrate 111 and the upper protective layer 117. The through via 119 may be electrically connected to the wirings of the wiring layer 113. The through via 119 may include a conductive material.

Although the base structure 110 is illustrated in the drawing as including the base substrate 111, the wiring layer 113 and the through via 119, the example embodiments of the disclosure are not limited thereto. In an embodiment, the base structure 110 may be an interposer. In addition, in an embodiment, the base structure 110 may include a memory device. For example, the memory device may be a volatile memory such as dynamic random access memory (DRAM) or a non-volatile memory such as a flash memory, a phase-changeable random access memory (PRAM), a magneto-resistive random access memory (MRAM), a ferroelectric random access memory (FeRAM), a resistive random access memory (RRAM), etc. In an embodiment, the base structure 110 may include a logic circuit. For example, the logic circuit may include a central processing unit (CPU), a graphics processing unit (GPU), a modem, an application-specific integrated circuit (ASIC), a field programmable gate array (FPGA), etc. In addition, in an embodiment, the base structure 110 may include a buffer chip.

The connecting terminal 120 may be disposed at a bottom portion of the base structure 110. The connecting terminal 120 may include a base pad 121 and a base bump 123. The base pad 121 may extend through the lower protective layer 115 of the base structure 110. Although the base pad 121 is shown in the drawing as protruding from the lower protective layer 115 at a portion thereof, the example embodiments of the disclosure are not limited thereto. The base pad 121 may be inserted into the lower protective layer 115, and a bottom surface of the base pad 121 may be aligned with or be coplanar with a bottom surface of the lower protective layer 115. The base bump 123 may be disposed at a bottom portion of the base pad 121. The base pad 121 and the base bump 123 may include a conductive material. The semiconductor package 100 may be mounted on an external device (for example, an interposer or a printed circuit board (PCB)) via the connecting terminal 120.

A plurality of lower semiconductor chips 130 may be disposed on the base structure 110. The lower semiconductor chip 130 adjacent the base structure 110 from among the plurality of lower semiconductor chips 130 may be vertically spaced apart from the base structure 110. Adjacent ones of the lower semiconductor chips 130 may be vertically spaced apart from each other.

Each of the plurality of lower semiconductor chips 130 may include a semiconductor substrate 131, a wiring layer 133, a lower protective layer 135, an upper protective layer 137, and a through via 139.

The semiconductor substrate 131 may be centrally disposed in the lower semiconductor chip 130. For example, the semiconductor substrate 131 may be a silicon-on-insulator (SOI) substrate or a germanium-on-insulator (GOI) substrate.

The wiring layer 133 may be disposed under the semiconductor substrate 131. A top surface of the wiring layer 133 may contact a bottom surface of the semiconductor substrate 131. The wiring layer 133 may include wirings, and an insulating film surrounding the wirings. The wiring layer 133 may include a conductive material.

The lower protective layer 135 may be disposed under the wiring layer 133. The lower protective layer 135 of the lower semiconductor chip 130 adjacent the base structure 110 may face the upper protective layer 117 of the base structure 110. The lower protective layer 135 may cover a bottom surface of the wiring layer 133. The lower protective layer 135 may protect the wiring layer 133. The lower protective layer 135 may include an insulating material.

The upper protective layer 137 may be disposed on or over the semiconductor substrate 131. The upper protective layer 137 may face the lower protective layer 135 of the lower semiconductor chip 130 adjacent thereto. The upper protective layer 137 may cover a top surface of the semiconductor substrate 131. The upper protective layer 137 may protect the semiconductor substrate 131. The upper protective layer 137 may include an insulating material.

The through via 139 may extend through the semiconductor substrate 131 and the upper protective layer 137. The through via 139 may include a conductive material.

The upper semiconductor chip 140 may be disposed on or over the plurality of lower semiconductor chips 130. The upper semiconductor chip 140 may be vertically spaced apart from the lower semiconductor chip 130 adjacent thereto. The upper semiconductor chip 140 may include a semiconductor substrate 141, a wiring layer 143, a lower protective layer 145, and an upper protective layer 147. The semiconductor substrate 141 may be centrally disposed in the upper semiconductor chip 140. The semiconductor substrate 141 may be a silicon-on-insulator (SOI) substrate or a germanium-on-insulator (GOI) substrate.

The wiring layer 143 may be disposed under the semiconductor substrate 141. A top surface of the wiring layer 143 may contact a bottom surface of the semiconductor substrate 141. The wiring layer 143 may include wirings, and an insulating film surrounding the wirings. The wiring layer 143 may include a conductive material.

The lower protective layer 145 may be disposed under the wiring layer 143. The lower protective layer 145 may face the upper protective layer 137 of the lower semiconductor chip 130 adjacent thereto. The lower protective layer 145 may cover a bottom surface of the wiring layer 143. The lower protective layer 145 may protect the wiring layer 143. The lower protective layer 145 may include an insulating material.

The upper protective layer 147 may be disposed on or over the semiconductor substrate 141. The upper protective layer 147 may cover a top surface of the semiconductor substrate 141. The upper protective layer 147 may protect the semiconductor substrate 141. The upper protective layer 147 may include an insulating material.

The connecting structure 150 may be disposed between the base structure 110 and the lower semiconductor chip 130 adjacent the base structure 110, between the adjacent lower semiconductor chips 130, and between the upper semiconductor chip 140 and the lower semiconductor chip 130 adjacent the upper semiconductor chip 140.

The connecting structure 150 may electrically interconnect the base structure 110 and the lower semiconductor chip 130 adjacent the base structure 110, may electrically interconnect the adjacent lower semiconductor chips 130, and may electrically interconnect the upper semiconductor chip 140 and the lower semiconductor chip 130 adjacent the upper semiconductor chip 140.

The connecting structure 150 may include a lower pad 151, an upper pad 153, and a connecting bump 155.

The lower pad 151 may be disposed at a top portion of the base structure 110 and a top portion of the lower semiconductor chip 130. A bottom surface of the lower pad 151 adjacent the base structure 110 may contact a top surface of the through via 119 of the base structure 110. A bottom surface of the lower pad 151 adjacent the lower semiconductor chip 130 may contact a top surface of the through via 139 of the lower semiconductor chip 130 adjacent the lower pad 151. A bottom surface of the lower pad 151 adjacent the upper semiconductor chip 140 may contact a top surface of the through via 139 of the lower semiconductor chip 130 adjacent the upper semiconductor chip 140. The lower pad 151 may be electrically connected to the through via 119 of the base structure 110 or the through via 139 of the lower semiconductor chip 130.

The upper pad 153 may be disposed at a bottom portion of the lower semiconductor chip 130 and a bottom portion of the upper semiconductor chip 140. A top surface of the upper pad 153 adjacent the lower semiconductor chip 130 may contact a bottom surface of the wiring layer 133 of the lower semiconductor chip 130 adjacent the base structure 110. A top surface of the upper pad 153 adjacent the upper semiconductor chip 140 may contact a bottom surface of the wiring layer 143 of the upper semiconductor chip 140. The upper pad 153 may be electrically connected to the wiring layer 133 of the lower semiconductor chip 130 or the wiring layer 143 of the upper semiconductor chip 140.

The connecting bump 155 may be disposed between the lower pad 151 and the upper pad 153. A bottom surface of the connecting bump 155 may contact a top surface of the lower pad 151. A top surface of the connecting bump 155 may contact a bottom surface of the upper pad 153. The connecting bump 155 may be electrically connected to the lower pad 151 and the upper pad 153.

The lower adhesive layer 160 may be interposed between the base structure 110 and the lower semiconductor chip 130 adjacent the base structure 110 and between the adjacent lower semiconductor chips 130. The lower adhesive layer 160 may include a lower adhesive portion 161 and a lower protrusion portion 163. The lower adhesive portion 161 may be disposed between the base structure 110 and the lower semiconductor chip 130 adjacent the base structure 110, between the adjacent lower semiconductor chips 130, and between the upper semiconductor chip 140 and the lower semiconductor chip 130 adjacent the upper semiconductor chip 140. For example, the height of the lower adhesive portion 161 may be $h_1$. A side surface of the lower adhesive portion 161 may be aligned with a side surface of the base structure 110, the lower semiconductor chip 130 or the upper semiconductor chip 140 adjacent the lower adhesive portion 161. The lower adhesive portion 161 may surround the connecting structure 150. The lower adhesive portion 161 may inter-bond or bond the base structure 110 and the lower semiconductor chip 130 adjacent the base structure 110, may inter-bond or bond the adjacent lower semiconductor chips 130, and may inter-bond or bond the upper semiconductor chip 140 and the lower semiconductor chip 130 adjacent the upper semiconductor chip 140.

The lower protrusion portion 163 may be disposed at opposite sides of the lower adhesive portion 161. The width of the lower protrusion portion 163 may be $W_1$. When viewed in FIG. 1A, the width of the lower protrusion portion 163 may mean the maximum distance between an outer surface of the lower protrusion portion 163 and the side surface of the lower adhesive portion 161 contacting the lower protrusion portion 163. The lower protrusion portion 163 may surround at least a portion of the side surface of the base structure 110, the lower semiconductor chip 130 or the upper semiconductor chip 140. In an embodiment, the lower adhesive layer 160 may not include the lower protrusion portion 163. The lower adhesive layer 160 may include at least one of an epoxy series resin, a filler, and an additive.

The dummy chip 170 may be disposed on or over the upper semiconductor chip 140. The dummy chip 170 may be vertically spaced apart from the upper semiconductor chip 140. The dummy chip 170 may face the upper semiconductor chip 140. The dummy chip 170 may face the upper protective layer 147 of the upper semiconductor chip 140. Although the width of the dummy chip 170 is shown in the drawing as being equal to the width of the upper semiconductor chip 140, the example embodiments of the disclosure are not limited thereto. For example, the dummy chip 170 may be a bare silicon wafer, a core wafer, or a metal plate.

The upper adhesive layer 180 may include an upper adhesive portion 181 and an upper protrusion portion 183. The upper adhesive portion 181 may be disposed between the upper semiconductor chip 140 and the dummy chip 170. Opposite side surfaces of the upper adhesive portion 181 may be aligned with opposite side surfaces of at least one of the upper semiconductor chip 140 and the dummy chip 170. A bottom surface of the upper adhesive portion 181 may contact a top surface of the upper semiconductor chip 140, and a top surface of the upper adhesive portion 181 may contact a bottom surface of the dummy chip 170. A height $h_2$ of the upper adhesive portion 181 may be smaller than the height $h_1$ of the lower adhesive portion 161 of the lower adhesive layer 160. The upper adhesive portion 181 may bond the upper semiconductor chip 140 and the dummy chip 170 to each other.

The upper protrusion portion 183 may be disposed at opposite sides of the upper adhesive portion 181. The upper protrusion portion 183 may surround portions of the opposite side surfaces of the upper semiconductor chip 140, the opposite side surfaces of the upper adhesive portion 181, and the opposite side surfaces of the dummy chip 170. A width $W_2$ of the upper protrusion portion 183 may be smaller than the width $W_1$ of the lower protrusion portion 163 of the lower adhesive layer 160. In an embodiment, the upper protrusion portion 183 may contact the lower protrusion portion 163 of the lower adhesive layer 160 adjacent thereto. In another embodiment, the upper adhesive layer 180 may not include the upper protrusion portion 183. For example, the upper adhesive layer 180 may include at least one an epoxy series resin, a filler, and an additive. In an embodiment, the upper adhesive layer 180 may include a material different from that of the lower adhesive layer 160. For example, the upper adhesive layer 180 may include an adhesive polymer material different from that of the lower adhesive layer 160.

The molding layer 190 may be disposed on or over the base structure 110. A bottom surface of the molding layer 190 may contact a top surface of the upper protective layer 117 of the base structure 110. A top surface of the molding layer 190 may be aligned with a top surface of the dummy chip 170. That is, the top surface of the molding layer 190 may be coplanar with the top surface of the dummy chip 170. In an embodiment, the molding layer 190 may cover portions of side surfaces of the lower semiconductor chip 130, portions of the side surfaces of the upper semiconductor chip 140, an overall portion or an entirety of the outer surface of the lower protrusion portion 163 of the lower adhesive layer 160, portions of the side surfaces of the dummy chip 170, and an overall portion or an entirety of an outer surface of the upper protrusion portion 183 of the upper adhesive layer 180. In an embodiment, when the lower protrusion portion 163 of the lower adhesive layer 160 and the upper protrusion portion 183 of the upper adhesive layer 180 are not present, the molding layer 190 may cover overall portions or the entirety of the side surfaces of the lower semiconductor chip 130, overall portions or the entirety of the side surfaces of the upper semiconductor chip 140, an overall portion or the entirety of the side surface of the lower adhesive portion 161 of the lower adhesive layer 160, overall portions or the entirety of the side surfaces of the dummy chip 170, and an overall portion or the entirety of a side surface of the upper adhesive portion 181 of the upper adhesive layer 180. For example, the molding layer 190 may include an epoxy molding compound (EMC), a thermoplastic resin such as polyimide, or a resin formed by including a reinforcement such as an inorganic filler in the EMC or the thermoplastic resin, in detail, an Ajinomoto build-up film (ABF), FR-4, bismaleimide triazine (BT), etc., or may include a molding material such as an EMC or a photo-imageable encapsulant (PIE).

Referring to FIG. 1B, the molding layer 190 may cover upper portions of the side surfaces of the dummy chip 170 and, as such, the upper adhesive layer 180 may not be exposed when viewed in a top view. Accordingly, the semiconductor package 100 may have enhanced reliability.

FIGS. 2A to 2M are sectional views explaining a method for manufacturing a semiconductor package in accordance with an example embodiment of the disclosure.

Referring to FIG. 2A, a base structure 110 including a base substrate 111, a wiring layer 113, a lower protective layer 115 and a through via 119 may be formed. Formation of the base structure 110 may include forming the base substrate 111, forming the through via 119 in the base substrate 111, forming the wiring layer 113 on the base substrate 111, and forming the lower protective layer 115 on the wiring layer 113. A base pad 121 may be formed on the base structure 110, and a base bump 123 may be formed on the base pad 121.

Referring to FIG. 2B, the base structure 110 may be attached to a first carrier substrate CAR1 using a first glue layer GL1. The lower protective layer 115 of the base structure 110 may contact the first glue layer GL1. The base bump 123 may be surrounded by the first glue layer GL1.

Figure 2C:
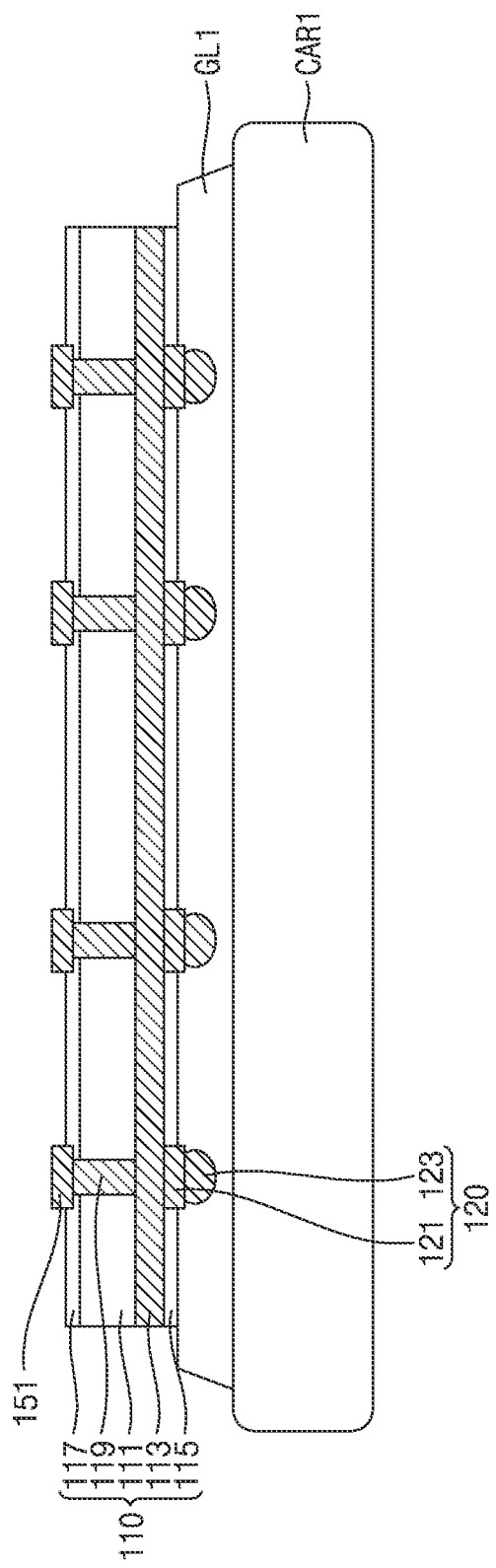
Figure 21:
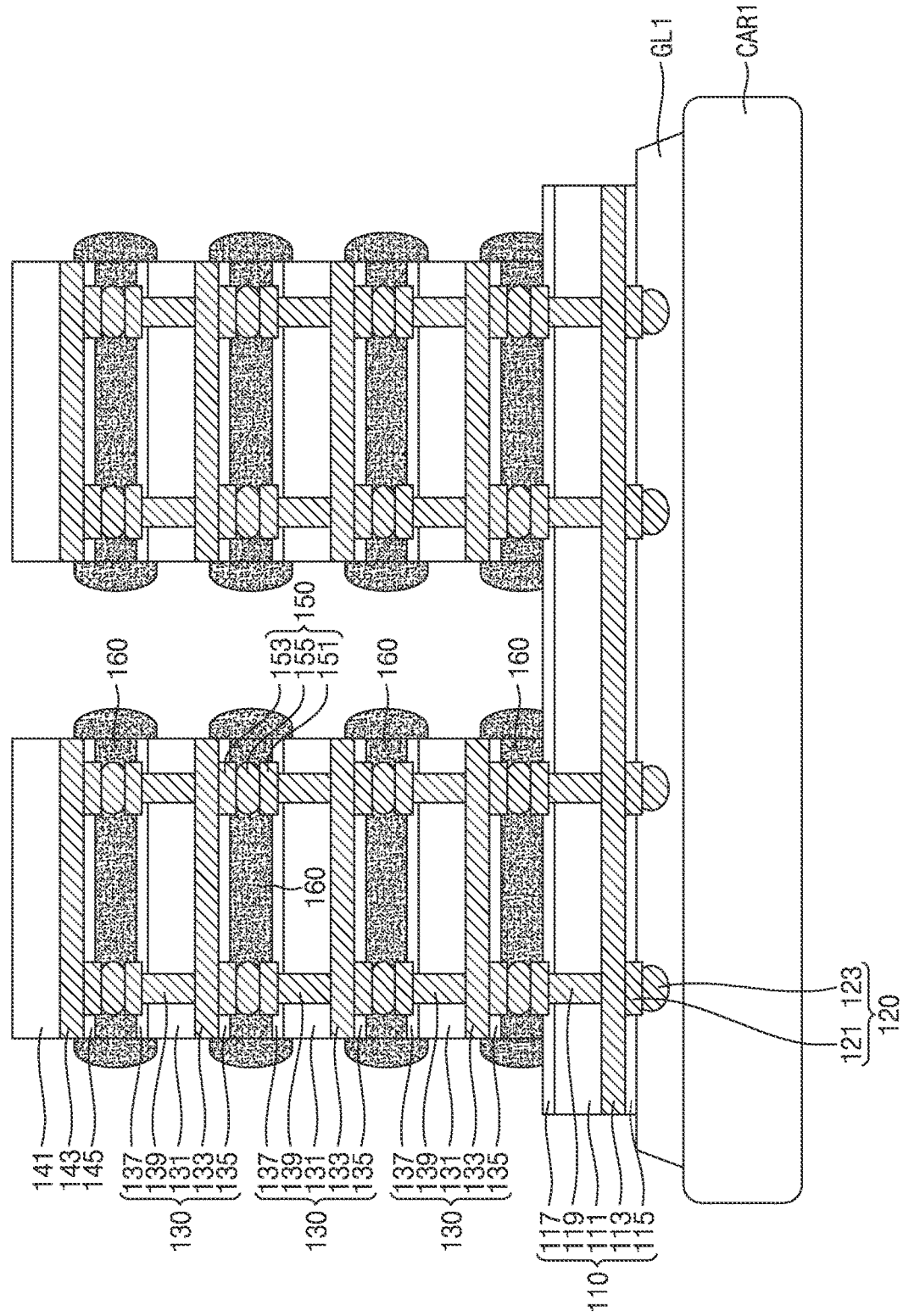

Referring to FIG. 2C, an upper protective layer 117 may be formed on the base substrate 111. In an embodiment, formation of the upper protective layer 117 may include forming, on the base substrate 111, a preliminary upper protective layer covering the through via 119, and removing an upper portion of the preliminary upper protective layer, thereby exposing the through via 119. A lower pad 151 may be formed on the through via 119.

Referring to FIG. 2D, a preliminary lower semiconductor chip P130 including a semiconductor substrate 131, a wiring layer 133, a lower protective layer 135, an upper protective layer 137, a through via 139, a lower pad 151, an upper pad 153, and a connecting bump 155 may be formed through processes similar to processes as described above. A second carrier substrate CAR2 may be attached to the preliminary lower semiconductor chip P130 using a second glue layer GL2. A first tape TP1 covering the upper protective layer 137 and the lower pad 151 may be formed. The first tape TP1 may contact the upper protective layer 137 and the lower pad 151.

Referring to FIG. 2E, the preliminary lower semiconductor chip P130 may be inverted using the first tape TP1. As the preliminary lower semiconductor chip P130 is inverted, the second carrier substrate CAR2 and the second glue layer GL2 may be disposed over the preliminary lower semiconductor chip P130. The second carrier substrate CAR2 and the second glue layer GL2 may be removed. As the second carrier substrate CAR2 and the second glue layer GL2 are removed, the upper pad 153 and the connecting bump 155 on the preliminary lower semiconductor chip P130 may be exposed.

Referring to FIG. 2F, a preliminary lower adhesive layer P160 covering the lower protective layer 135 of the preliminary lower semiconductor chip P130, the upper pad 153 and the connecting bump 155, and a second tape TP2 supporting the preliminary lower adhesive layer P160 may be formed. The preliminary lower adhesive layer P160 may contact the lower protective layer 135, the upper pad 153, and the connecting bump 155. The second tape TP2 may be spaced apart from the lower protective layer 115, the upper pad 153, and the connecting bump 155. In an embodiment, formation of the preliminary adhesive layer P160 and the second tape TP2 may include forming the preliminary adhesive layer P160 on the second tape TP2, and bonding the preliminary lower semiconductor chip P130 to the preliminary lower adhesive layer P160. The preliminary lower semiconductor chip P130 may be inverted using the first tape TP1 and the second tape TP2. As the preliminary lower semiconductor chip P130 is inverted, the first tape TP1 may be disposed over the preliminary lower semiconductor chip P130. In an embodiment, the second glue layer GL2 and the second carrier substrate CAR2 may be removed, and the lower adhesive layer 160 and the second tape PT2 may be formed, without using the process of inverting the preliminary lower semiconductor chip P130, differently from the case as described above.

Referring to FIG. 2G, the preliminary lower semiconductor chip P130 and the preliminary lower adhesive layer 160 may be divided into a plurality of lower semiconductor chips 130 and a plurality of lower adhesive layers 160. In an embodiment, division of the preliminary lower semiconductor chip P130 and the preliminary lower adhesive layer 160 into the plurality of lower semiconductor chips 130 and the plurality of lower adhesive layers 160 may include removing the first tape TP1 on the preliminary lower semiconductor chip P130, and dividing the preliminary lower semiconductor chip P130 and the preliminary lower adhesive layer P160. For example, the preliminary lower semiconductor chip P130 and the preliminary lower adhesive layer 160 may be divided into the plurality of lower semiconductor chips 130 and the plurality of lower adhesive layers 160 through a dicing process. The plurality of divided lower semiconductor chips 130 and the plurality of divided lower adhesive layers 160 may be interconnected by the second tape TP2.

Division of the preliminary lower semiconductor chip P130 into the plurality of lower semiconductor chips 130 may include dividing the upper protective layer 137 into a plurality of pieces, dividing the semiconductor substrate 131 into a plurality of pieces, dividing the wiring layer 133 into a plurality of pieces, and dividing the lower protective layer 135 into a plurality of pieces.

Referring to FIG. 2H, each lower semiconductor chip 130 and each lower adhesive layer 160 may be disposed on the base structure 110. When the lower semiconductor chip 130 and the lower adhesive layer 160 are disposed on the base structure 110, the shape of the lower adhesive layer 160 may be varied and, as such, a lower protrusion portion 163 may be formed. The lower protrusion portion 163 may surround a portion of a side surface of the lower semiconductor chip 130.

Each lower semiconductor chip 130 may be mounted on the base structure 110. Mounting of the lower semiconductor chip 130 on the base structure 110 may include separating the lower semiconductor chip 130 from the second tape TP2, and inter-bonding or bonding the connecting bump 155 connected to the lower semiconductor chip 130 and the lower pad 151 connected to the base structure 110. For example, the connecting bump 155 connected to the lower semiconductor chip 130 and the lower pad 151 connected to the base structure 110 may be inter-bonded through a thermal compression process, a mass flow process or a laser assisted bonding process. As the connecting bump 155 connected to the lower semiconductor chip 130 and the lower pad 151 connected to the base structure 110 are inter-bonded, a connecting structure 150 including the lower pad 151, the upper pad 153 and the connecting bump 155 may be formed.

For example, inter-bonding of the connecting bump 155 connected to the lower semiconductor chip 130 and the lower pad 151 connected to the base structure 110 may be performed at a first temperature. Additionally or alternatively, inter-bonding of the connecting bump 155 connected to the lower semiconductor chip 130 and the lower pad 151 connected to the base structure 110 may include compressing the lower semiconductor chip 130 and the lower adhesive layer 160 against the base structure 110 under a first pressure.

In an embodiment, attachment of the lower adhesive layer 160 to the base structure 110 and inter-bonding of the connecting bump 155 connected to the lower semiconductor chip 130 and the lower pad 151 connected to the base structure 110 may be simultaneously performed.

Referring to FIG. 2I, a plurality of lower semiconductor chips 130, a plurality of connecting structures 150 and a plurality of lower adhesive layers 160 disposed among the lower semiconductor chips 130 may be formed in a vertically stacked state through processes similar to processes as described above. In addition, an upper semiconductor chip 140 including a semiconductor substrate 141, a wiring layer 143, a lower protective layer 145 and an upper protective layer 147, and a connecting structure 150 and a lower adhesive layer 160 disposed between the upper semiconductor chip 140 and the lower semiconductor chip 130 adjacent the upper semiconductor chip 140 may be formed.

Figure 2J:
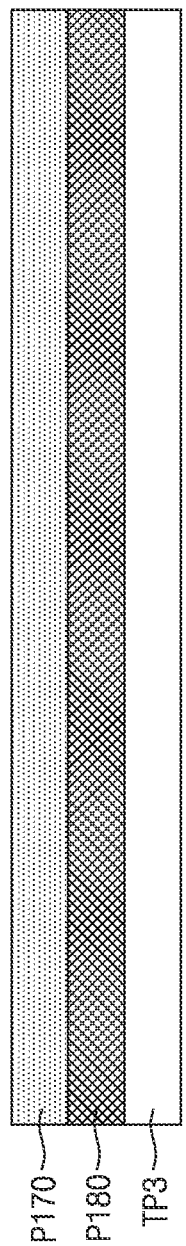

Referring to FIG. 2J, a preliminary dummy chip P170, a preliminary upper adhesive layer P180 covering a bottom surface of the preliminary dummy chip P170, and a third tape TP3 supporting the preliminary upper adhesive layer P180 may be formed. In an embodiment, formation of the preliminary upper adhesive layer P180 and the third tape TP3 may include forming the preliminary upper adhesive layer P180 on the second tape TP2, and bonding the preliminary dummy chip P170 to the preliminary upper adhesive layer P180.

Figure 2K:
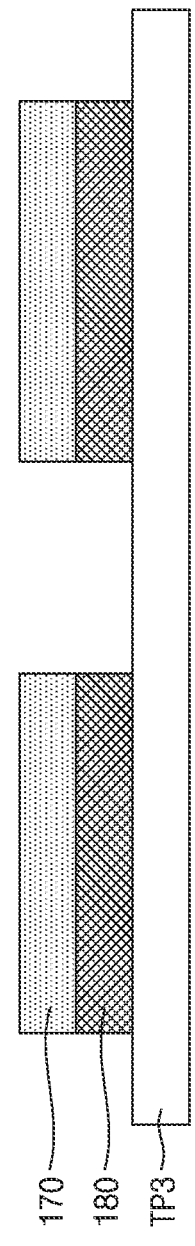

Referring to FIG. 2K, the preliminary dummy chip P170 may be divided into a plurality of dummy chips 170, and the preliminary upper adhesive layer P180 may be divided into a plurality of upper adhesive layers 180. For example, the preliminary dummy chip P170 and the preliminary upper adhesive layer P180 may be simultaneously divided into the plurality of dummy chips 170 and the plurality of upper adhesive layers 180 through a dicing process. In an embodiment, the preliminary dummy chip P170 and the preliminary upper adhesive layer P180 may be divided into the plurality of dummy chips 170 and the plurality of upper adhesive layers 180 after removal of the third tape TP3.

Referring to FIG. 2L, the dummy chip 170 and the upper adhesive layer 180 may be disposed on the upper semiconductor chip 140. Disposition of the dummy chip 170 and the upper adhesive layer 180 on the upper semiconductor chip 140 may include compressing the dummy chip 170 and the upper adhesive layer 180 against the upper semiconductor chip 140 at a second temperature and under a second pressure. For example, the second temperature may be lower than the first temperature, and the second pressure may be lower than the first pressure.

When the dummy chip 170 and the upper adhesive layer 180 are disposed on the upper semiconductor chip 140, the shape of the upper adhesive layer 180 may be varied and, as such, an upper protrusion portion 183 may be formed. The upper protrusion portion 183 may surround a portion of a side surface of a lower portion (or a lower portion of a side surface) of the dummy chip 170.

Referring to FIG. 2M, a molding layer 190 may be formed to cover a top surface of the base structure 110, side surfaces of the lower semiconductor chips 130, a side surface of the upper semiconductor chip 140, side surfaces of the lower adhesive layers 160, a side surface of the upper adhesive layer 180, and a side surface of the dummy chip 170. A top surface of the molding layer 190 may be aligned with or be coplanar with a top surface of the dummy chip 170. The molding layer 190 may surround a side surface of an upper portion (or an upper portion of a side surface) of the dummy chip 170. As such, when viewed in a top view, in the semiconductor package 100, only the dummy chip 170 and the molding layer 190 may be viewed, and the upper adhesive layer 180 may not be viewed. Accordingly, reliability of the semiconductor package 100 may be enhanced.

Figure 3:
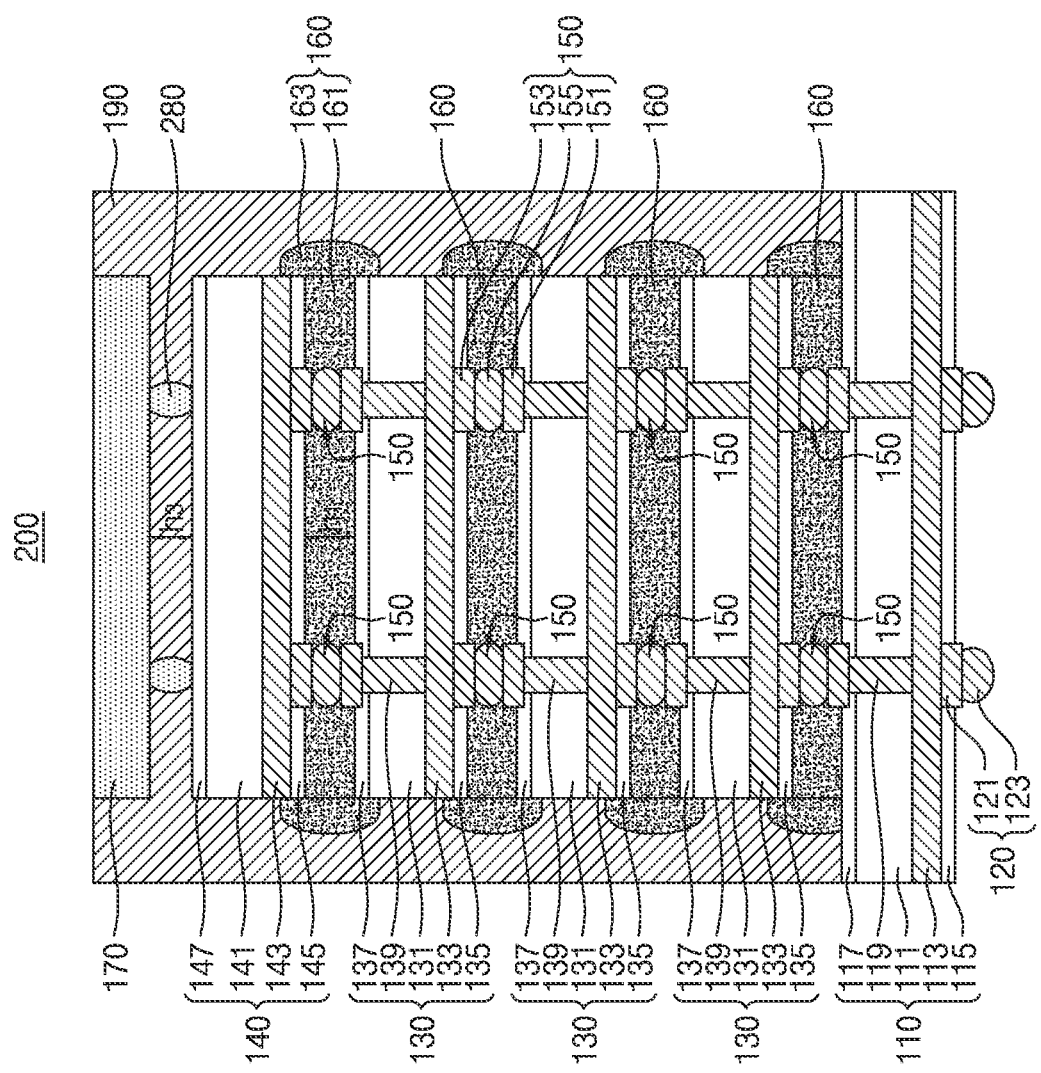
FIG. 3 is a sectional view of a semiconductor package according to an example embodiment of the disclosure.

FIG. 3 is a sectional view of a semiconductor package according to an example embodiment of the disclosure.

Referring to FIG. 3, a semiconductor package 200 may include a base structure 110, a connecting terminal 120, a lower semiconductor chip 130, an upper semiconductor chip 140, a connecting structure 150, a lower adhesive layer 160, a dummy chip 170, a solder 280, and a molding layer 190.

The solder 280 may be disposed between the upper semiconductor chip 140 and the dummy chip 170. A bottom surface of the solder 280 may contact a top surface of the upper semiconductor chip 140, and a top surface of the solder 280 may contact a bottom surface of the dummy chip 170. The solder 280 may support the dummy chip 170. A side surface of the solder 280 may be surrounded by the molding layer 190. A height $h_3$ of the solder 280 may differ from a height $h_1$ of a lower adhesive portion 161 of the lower adhesive layer 160. For example, the height $h_3$ of the solder 280 may be smaller than the height $h_1$ of the lower adhesive portion 161 of the lower adhesive layer 160. The solder 280 may include at least one of tin (Sn) and silver (Ag).

Figure 4:
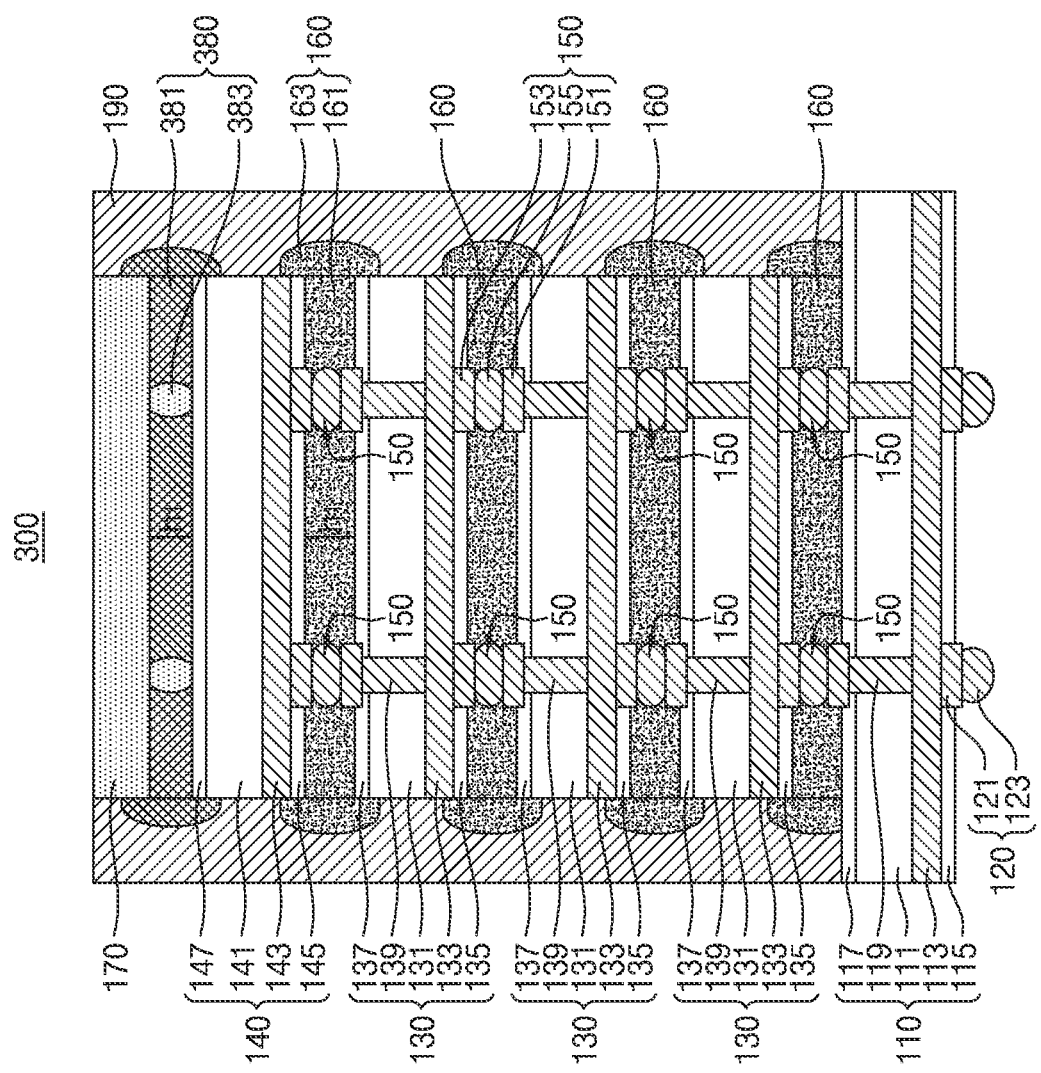
FIG. 4 is a sectional view of a semiconductor package according to an example embodiment of the disclosure.

FIG. 4 is a sectional view of a semiconductor package according to an example embodiment of the disclosure.

Referring to FIG. 4, a semiconductor package 300 may include a base structure 110, a connecting terminal 120, a lower semiconductor chip 130, an upper semiconductor chip 140, a connecting structure 150, a lower adhesive layer 160, a dummy chip 170, a support layer 380, and a molding layer 190.

The support layer 380 may include an upper adhesive layer 381 and a solder 383. The upper adhesive layer 381 may be identical to the upper adhesive layer 180 described with reference to FIGS. 1A and 1B, and the solder 383 may be identical to the solder 280 described with reference to FIG. 3. The upper adhesive layer 381 may surround the solder 383.

Figure 5:
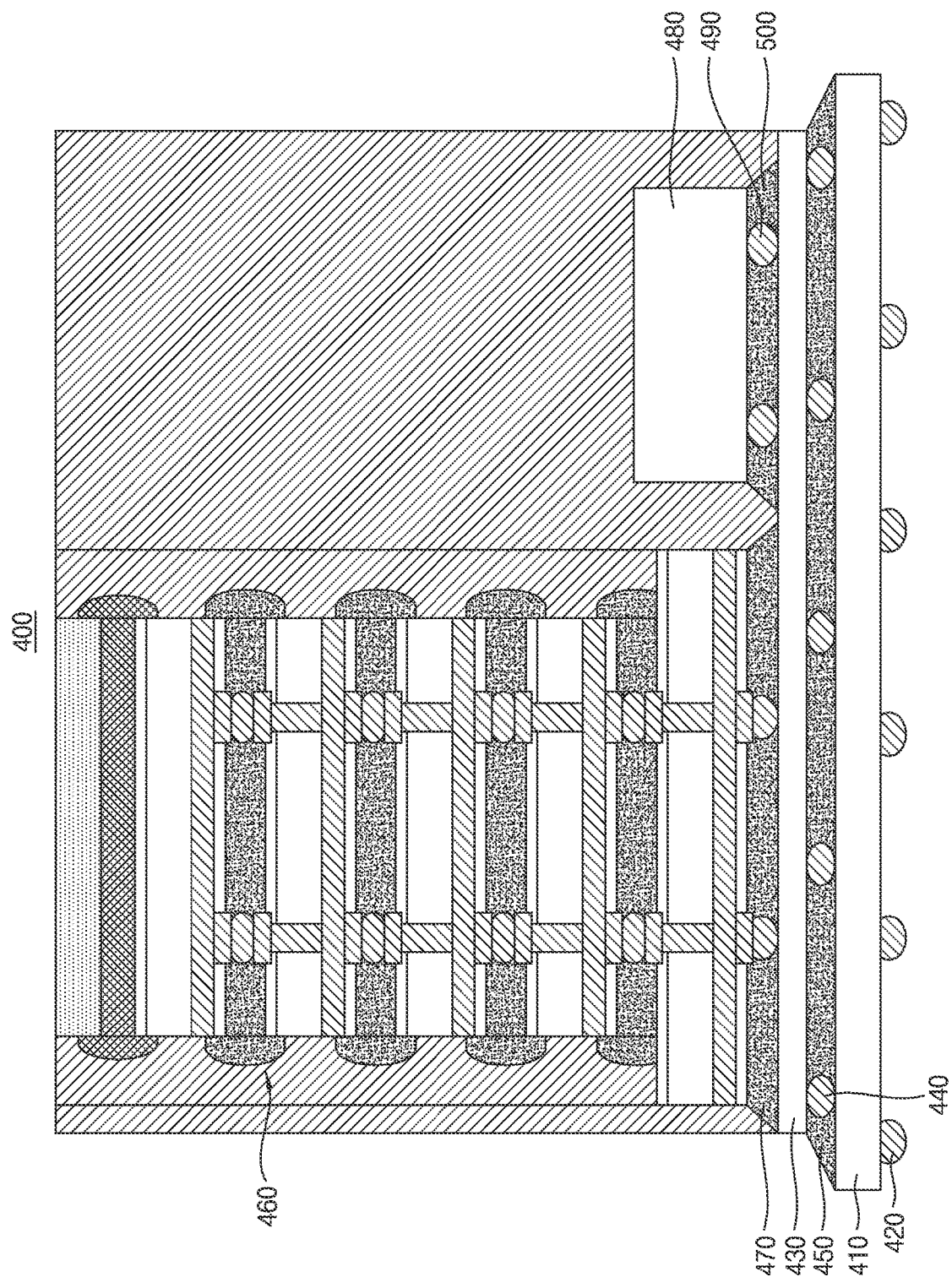
FIG. 5 is a sectional view of a semiconductor package according to an example embodiment of the disclosure.

FIG. 5 is a sectional view of a semiconductor package according to an example embodiment of the disclosure.

Referring to FIG. 5, a semiconductor package 400 may include a package substrate 410, a first connecting terminal 420, an interposer 430, a second connecting terminal 440, a first underfill film 450, a high-bandwidth memory (HBM) 460, a second underfill film 470, a processor chip 480, a third connecting terminal 490, and a third underfill film 500. For example, the package substrate 410 may be a printed circuit board (PCB). The first connecting terminal 420 may be disposed under the package substrate 410. The first connecting terminal 420 may include a conductive material. The semiconductor package 400 may be mounted on an external device (for example, a main board) via the first connecting terminal 420. The interposer 430 may be disposed on or over the package substrate 410. The second connecting terminal 440 may be disposed between the package substrate 410 and the interposer 430. The second connecting terminal 440 may electrically interconnect the package substrate 410 and the interposer 430. The second connecting terminal 440 may include a conductive material. The first underfill film 450 may be disposed between the package substrate 410 and the interposer 430. For example, the first underfill film 450 may include an insulating material.

The HBM 460 may be disposed on or over the interposer 430 at one side (e.g., a first side) of the interposer 430. The HBM 460 may be one of the semiconductor packages 100, 200 and 300 described with reference to FIGS. 1A, 3 and 4. The second underfill film 470 may be disposed between the interposer 430 and the HBM 460. For example, the second underfill film 470 may include an insulating material.

The processor chip 480 may be disposed on or over the interposer 430 at the other side (e.g., a second side) of the interposer 430. For example, the processor chip 480 may be a graphics processing unit (GPU) or a central processing unit (CPU). The third connecting terminal 490 may be disposed between the interposer 430 and the processor chip 480. The third connecting terminal 490 may electrically interconnect the interposer 430 and the processor chip 480. The third underfill film 500 may be disposed between the interposer 430 and the processor chip 480. For example, the third underfill film 500 may include an insulating material.

In a semiconductor package according to example embodiments of the disclosure, an adhesive layer thereof may not be exposed when viewed in a top view and, as such, reliability of the semiconductor package may be enhanced.

While the example embodiments of the disclosure have been described with reference to the accompanying drawings, it should be understood by those skilled in the art that various modifications may be made without departing from the scope of the disclosure and without changing essential features thereof. Therefore, the above-described example embodiments should be considered in a descriptive sense only and not for purposes of limitation.

What is claimed is:

1. A semiconductor package comprising:
   a base structure;
   a lower semiconductor chip disposed on the base structure;
   an upper semiconductor chip disposed on the lower semiconductor chip;
   a connecting structure comprising a lower pad disposed on the lower semiconductor chip, an upper pad disposed under the upper semiconductor chip, and a connecting bump disposed between the lower pad and the upper pad;
   a dummy chip disposed on the upper semiconductor chip;
   a lower adhesive layer comprising a lower adhesive portion disposed between the lower semiconductor chip and the upper semiconductor chip, and a lower protrusion portion disposed at opposite sides of the lower adhesive portion, to surround at least one of upper portions of opposite side surfaces of the lower semiconductor chip and lower portions of opposite side surfaces of the upper semiconductor chip;
   an upper adhesive layer comprising an upper adhesive portion disposed between the upper semiconductor chip and the dummy chip, and an upper protrusion portion disposed at opposite sides of the upper adhesive portion, to surround lower portions of opposite side surfaces of the dummy chip; and
   a molding layer disposed at opposite sides of the dummy chip, to surround upper portions of the opposite side surfaces of the dummy chip and the upper protrusion portion of the upper adhesive layer,
   wherein a thickness of the dummy chip is smaller than a thickness of each of the lower semiconductor chip and the upper semiconductor chip,
   wherein a thickness of the upper adhesive portion is smaller than a thickness of the lower adhesive portion,
   wherein the upper protrusion portion is vertically spaced apart from a top surface of the molding layer, and
   wherein the upper adhesive layer is free of any electrical connecting structures therein, wherein the lower semiconductor chip comprises; a semiconductor substrate; a wiring layer disposed under the semiconductor substrate; a lower protective layer disposed under the wiring layer; an upper protective layer disposed on the semiconductor substrate; and a through via extending through the semiconductor substrate and the upper protective layer, and wherein the lower protrusion portion contacts the side surfaces of the upper protective layer and the semiconductor substrate of the lower semiconductor chip and side surfaces of the lower protective layer and the wiring layer of the upper semiconductor chip.

2. The semiconductor package according to claim 1, the upper semiconductor chip comprises:
   a semiconductor substrate;

a wiring layer disposed under the semiconductor substrate;

a lower protective layer disposed under the wiring layer; and an upper protective layer disposed on the semiconductor substrate, wherein the upper protrusion portion contacts side surfaces of the upper protective layer and the semiconductor substrate of the upper semiconductor chip.

3. The semiconductor package according to claim 1, wherein the dummy chip comprises one of a bare silicon wafer, a core wafer, and a metal plate.

4. The semiconductor package according to claim 1, wherein a width of the upper protrusion portion is smaller than a width of the lower protrusion portion.

5. The semiconductor package according to claim 1, wherein the lower adhesive layer comprises at least one of an epoxy series resin, a filler, and an additive.

6. The semiconductor package according to claim 1, wherein the upper adhesive layer comprises at least one of an epoxy series resin, a filler, and an additive.

7. The semiconductor package according to claim 1, wherein the top surface of the molding layer is coplanar with a top surface of the dummy chip.

8. The semiconductor package according to claim 1, wherein opposite side surfaces of the molding layer are horizontally aligned with opposite side surfaces of the base structure.

9. The semiconductor package according to claim 1, further comprising:

a connecting terminal comprising a base pad disposed at a bottom portion of the base structure, and a base bump disposed at a bottom portion of the base pad.

10. A semiconductor package comprising:

a base structure;

a connecting terminal comprising a base pad at a bottom portion of the base structure, and a base bump under the base pad;

a lower semiconductor chip on the base structure, the lower semiconductor chip comprising a semiconductor substrate, a first wiring layer under the semiconductor substrate, a first lower protective layer under the first wiring layer, a first upper protective layer on the semiconductor substrate, and a through via extending through the semiconductor substrate and the first upper protective layer;

an upper semiconductor chip on the lower semiconductor chip, the upper semiconductor chip comprising a semiconductor substrate, a second wiring layer under the semiconductor substrate, a second lower protective layer under the second wiring layer, and a second upper protective layer on the semiconductor substrate;

a connecting structure comprising a lower pad on the lower semiconductor chip and connected to the through via of the lower semiconductor chip, an upper pad under the upper semiconductor chip and connected to the second wiring layer of the upper semiconductor chip, and a connecting bump between the lower pad and the upper pad to interconnect the lower pad and the upper pad;

a lower adhesive layer comprising a lower adhesive portion between the lower semiconductor chip and the upper semiconductor chip, and a lower protrusion portion at opposite sides of the lower adhesive portion to surround at least one of upper portions of opposite side surfaces of the lower semiconductor chip and lower portions of opposite side surfaces of the upper semiconductor chip;

a dummy chip on the upper semiconductor chip;

an upper adhesive layer comprising an upper adhesive portion between the upper semiconductor chip and the dummy chip, and an upper protrusion portion at opposite sides of the upper adhesive portion to surround lower portions of opposite side surfaces of the dummy chip; and a molding layer at opposite sides of the dummy chip to surround upper portions of the opposite side surfaces of the dummy chip and the upper protrusion portion, wherein a height of the upper adhesive portion is smaller than a height of the lower adhesive portion, wherein a width of the upper protrusion portion is smaller than a width of the lower protrusion portion, wherein a thickness of the dummy chip is smaller than a thickness of each of the lower semiconductor chip and the upper semiconductor chip, wherein the upper protrusion portion is vertically spaced apart from a top surface of the molding layer, wherein the lower protrusion portion contacts side surfaces of the first upper protective layer of the lower semiconductor chip and the second lower protective layer of the upper semiconductor chip, wherein the upper protrusion portion contacts a side surface of the second upper protective layer of the upper semiconductor chip, and wherein the upper adhesive layer is free of any electrical connecting structures therein, wherein the lower protrusion contacts side surfaces of the first upper protective layer and the semiconductor substrate of the lower semiconductor chip and side surfaces of the second lower protective layer and the second wiring layer of the upper semiconductor chip, and wherein the upper protrusion portion contacts side surfaces of the second upper protective layer and the semiconductor substrate of the upper semiconductor chip.

11. The semiconductor package according to claim 10, wherein:

the top surface of the molding layer is coplanar with a top surface of the dummy chip; and opposite side surfaces of the molding layer are horizontally aligned with opposite side surfaces of the base structure.

12. The semiconductor package according to claim 10, wherein a thickness of the upper adhesive portion is smaller than a thickness of the lower adhesive portion.

13. The semiconductor package according to claim 10, wherein a width of the upper protrusion portion is smaller than a width of the lower protrusion portion.

* * * * *